United States Patent
Ladret

(10) Patent No.: US 9,891,287 B2
(45) Date of Patent: Feb. 13, 2018

(54) TEMPERATURE-COMPENSATED STATE OF CHARGE ESTIMATION FOR RECHARGEABLE BATTERIES

(71) Applicant: STMicroelectronics International N.V., Amsterdam (NL)

(72) Inventor: Daniel Ladret, Lans-en-Vercors (FR)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 734 days.

(21) Appl. No.: 14/329,227

(22) Filed: Jul. 11, 2014

(65) Prior Publication Data

US 2015/0025823 A1 Jan. 22, 2015

(30) Foreign Application Priority Data

Jul. 16, 2013 (EP) ..................................... 13368022

(51) Int. Cl.
*G01R 31/36* (2006.01)

(52) U.S. Cl.
CPC ....... *G01R 31/3675* (2013.01); *G01R 31/362* (2013.01); *G01R 31/3624* (2013.01); *G01R 31/3662* (2013.01)

(58) Field of Classification Search
CPC ............... H02M 3/157; H02M 1/0845; H02M 2001/008; H02M 2001/0012; H02M 2001/007; H02M 3/156; H02M 3/1588; H02M 2001/0074; H02M 3/1582; H02M 3/1584; H02M 3/33592; Y10T 307/438; Y10T 307/469
See application file for complete search history.

(56) References Cited

U.S. PATENT DOCUMENTS

| 5,587,660 A * | 12/1996 | Chabbert ........... G01R 31/3651 |
| | | 324/426 |
| 2005/0154544 A1 | 7/2005 | Ono |
| 2010/0153038 A1 | 6/2010 | Tomura et al. |
| 2010/0185405 A1 | 7/2010 | Aoshima et al. |
| 2010/0250038 A1 | 9/2010 | Morita et al. |
| 2011/0234166 A1* | 9/2011 | Liu ..................... G01R 31/3662 |
| | | 320/132 |
| 2012/0200257 A1 | 8/2012 | Schwarz et al. |

(Continued)

FOREIGN PATENT DOCUMENTS

EP 1995123 A1 11/2008

OTHER PUBLICATIONS

Woodbank Communications Ltd, South Crescent Road, Chester, CH4 7AU, (United Kingdom) Copyright Woodbank Communications Ltd 2005 http://www.mpoweruk.com/soc.htm.*

(Continued)

*Primary Examiner* — Roy Y Yi
(74) *Attorney, Agent, or Firm* — Gardere Wynne Sewell LLP

(57) ABSTRACT

The remaining state of charge of a rechargeable battery is calculated by: measuring the instantaneous voltage, impedance and temperature of the battery, and then inputting the measured voltage, impedance and temperature values into an equation, wherein the equation yields a state of charge value that is a function of the said measured voltage, impedance and temperature values.

19 Claims, 2 Drawing Sheets

(56) References Cited

U.S. PATENT DOCUMENTS

2013/0138370 A1    5/2013  Oh et al.

OTHER PUBLICATIONS

EPO Search Report and Written Opinion for EP 13368022.3 dated Oct. 25, 2013 (7 pages).
Pop V et al: "Review Article; State-of-the-Art of Battery State-of-Charge Determination; Review Article," Measurement Science and Technology, IOP, Bristol, GB, vol. 16, No. 12, Dec. 1, 2005, pp. R93-R110, XP020090492.

* cited by examiner

TEMPERATURE-COMPENSATED STATE OF CHARGE ESTIMATION FOR RECHARGEABLE BATTERIES

PRIORITY CLAIM

This application claims priority from European Application for Patent No. 13368022.3 filed Jul. 16, 2013, the disclosure of which is incorporated by reference.

TECHNICAL FIELD

This invention relates to systems and methods for estimating the instantaneous state of charge (SoC) of a rechargeable battery, and in particular, but without limitation, to systems and methods that estimate the SoC with temperature compensation.

BACKGROUND

Many portable electronic devices that are powered by rechargeable batteries incorporate a "fuel gauge" type indicator, commonly on the graphical user interface, which provides an estimate of the remaining battery charge level. The indicator provides a useful tool that enables a user of the device to monitor the remaining charge level and to estimate when a re-charge may be necessary and/or to modify his/her usage of the device to conserve battery power.

Most fuel gauge SoC indicators display the remaining battery charge level as a percentage of the fully-charged battery capacity, a current value (typically in mAh), or a time to a particular threshold value (e.g. 10% remaining) based on the average historical, or instantaneous, battery discharge rate.

Typically, a SoC indicator provides a 100% reading when the battery is fully charged and 0% when the battery approaches, or reaches, a lower threshold value. The lower threshold value varies from device to device, but is usually a level at which certain background functions of the device are able to operate, such as a battery charge controller circuit. Many modern portable electronic devices comprise "throttling" technology that disables certain features, to conserve battery power, as the SoC falls below a series of threshold values. For example, WiFi can be disabled at one threshold value, the screen brightness may dim at another threshold value etc. Such battery conservation systems are relatively well-known.

Nevertheless, the lowermost threshold value is typically, for a mobile telephone, where the remaining battery voltage drops to a value between 3.2V to 3.0V, say, in the case of a lithium, or lithium polymer 1-cell battery.

The SoC estimation can be performed, in known systems, by two main methods: a "voltage" approach, whereby the voltage is measured and compared with values stored in a look-up table using the impedance to take the voltage drop into account. The reading from the look-up table giving the SoC or remaining capacity; and a "coulomb counter", whereby the SoC calculation is based on measuring the current flowing into, and out of, the battery through a sense resistor. Summing the "in" and "out" currents yields the total charge contained within the battery, enabling its SoC to be calculated.

These two techniques are often used together using proprietary algorithms to improve the SoC calculation accuracy.

In order to populate the look-up table for the "voltage" method, the battery, or a representative sample of batteries, needs to be tested. In this test, or series of tests, the impedance of the battery is calculated by a so-called "relaxation method", which involves measuring the battery's impedance after a specified rest time prior to measuring the open-circuit voltage. Experimentally, the specified rest time can be around 1 hour: being the time taken to approach the asymptote. The impedance is then calculated as the ratio of the voltage difference between the minimum voltage reached by the battery under current load and the relaxed voltage after the rest divided by the current load, as set out in Equation 1 below:

$$Z_{int} = (V_{rest} - V_{min})/I_{Load} \qquad (Eq. 1)$$

Where
  $Z_{int}$ is the internal battery impedance
  $V_{rest}$ is the battery voltage after a rest
  $V_{min}$ is the battery voltage loaded by the current $I_{Load}$
  $I_{load}$ is the current load applied to discharge the battery for a while (discharge pulse time depends on the number of points to characterize the battery impedance).

One of the main problems, associated with "fuel gauge" type SoC indicators when estimating the remaining capacity of the battery, is the variation of the battery impedance with temperature, which problem becomes even more evident when the ambient temperature is low or very low. Specifically, at low temperatures, the battery capacity reduces considerably, often to near-zero, due to the large increase in battery impedance, which varies inversely with temperature. Therefore, say, if battery is maintained at in ambient conditions of 0° C., the battery temperature will eventually equalize at 0° C. and the impedance could increase by a factor of 10 or more. As a result, a device, such as a mobile telephone, powered by the battery could be used, but the usage time would be reduced drastically because the voltage drop would follow the battery impedance, according to Equation 2 below:

$$V_{bat} = V_{OCV} - Z_{int}(T) \times I_{Load} \qquad (Eq. 2)$$

Where
  $V_{bat}$ is the battery voltage measured
  $V_{OCV}$ is the open-circuit voltage of the battery
  T is the temperature of the battery
  $Z_{int}(T)$ is the internal impedance at the temperature T
  $I_{Load}$ is the current load discharging the battery As such, when the ambient, and hence the battery, temperature falls below a "normal" value, i.e. 20° C. or room temperature, existing "fuel gauge" type SoC algorithms fail to operate predictably, that is to say, their estimation of remaining battery capacity become inaccurate. A need therefore exists for an SoC system and/or method that includes temperature compensation, and in particular, temperature compensation that takes into account the effect of temperature on the battery's impedance.

The current state of the art does this in a number of ways:

Firstly, it is possible, if the device is unlikely to be used in extreme cold conditions, to ignore the effect of temperature. In many cases, this is entirely possible simply by stating an "operational temperature range", close to room temperature, and providing a caveat to the user that the SoC indication might be inaccurate outside this range. In most consumer applications, where the device, such as a smart phone, is used at room temperature, this solution rarely causes problems.

However, ignoring the effect of temperature is not possible where, for example, the portable device is intended to be used in a critical situation (e.g. for emergency services), where it is designed to be used outdoors and/or in harsh environments (e.g. military grade devices), in relatively high power-consumption devices whereby any over-estimation of the SoC could cause the device to restart or cease to function prematurely, or indeed, for "premium" products whereby an accurate SoC indication is just necessary.

The most common temperature compensation technique involves using a series of look-up tables corresponding to different temperature points or ranges. The device therefore simply needs to take a temperature reading to select the appropriate look-up table to refer to when calculating the SoC. This can provide a sufficiently accurate SoC estimation for most uses. Known SoC methodologies are described, for example, in "Battery management systems—accurate State-of-charge indications for battery-powered applications" by V. Pop et al. (the disclosure of which is incorporated by reference) which describes a model using the EMF-state of charge relationship with a linear approach of each parameter of the model; and in "Battery management systems—Design by modelling" by H. J Bergveld, et al. (the disclosure of which is incorporated by reference), in which the temperature of the battery chemical reaction follows the Arrhenius law and this is applied to a defined model that is a physical model translated into an electrical model. These two last models are difficult to implement in a real situation.

As such, the only existing workable temperature-compensated SoC models make use of a number of look-up tables: the look-up tables, in each case, yielding an estimated SoC value for a given voltage and impedance measurement. However, a separate look-up table is needed for each temperature point or range and this necessarily requires a large number of data points to be included in the set of look-up tables for a given battery and SoC model. While existing systems, utilizing a number of look-up tables can be found to be sufficiently reliable, the population of the look-up tables is a time-consuming task, because each look-up value needs to be calculated separately in tests that can take two hours or more each to complete. This imposes a practical and economic limit on the accuracy and granularity of the look-up tables because the tables need to be re-calculated, ideally, for each battery and SoC model combination. In addition, look-up tables reside in memory, which is a critical consideration when trying to create a small fuel gauge implementation.

A need therefore exists for an alternative and/or an improved temperature-compensated SoC calculator, which preferably does not rely on accurately-calibrated look-up tables to perform temperature compensation.

SUMMARY

According to a first aspect, there is provided a method of calculating the remaining state of charge of a rechargeable battery, the method comprising the steps of: measuring the instantaneous voltage, impedance and temperature of the battery, inputting the measured voltage, impedance and temperature values into an equation, wherein the equation yields a state of charge value that is a function of the said measured voltage, impedance and temperature values.

Suitably, this provides an empirical estimation of the state of charge (remaining capacity) of the rechargeable battery, rather than a deterministic estimation based on looking-up a state of charge value from a selected one of a series of look-up tables corresponding to different temperature points or ranges. By using an equation, rather than look-up tables, the granularity of the state of charge calculation can, in principle, be infinitely small, depending on the accuracy of the equation. Also, the use of an equation suitably provides for interpolation, thus allowing the state of charge value to vary continuously, rather than in stepped increments, as is the case with a look-up table-based model.

Suitably, a first equation may be used above a threshold temperature value, and a second equation may be used below the threshold temperature value.

The equation suitably relates the change in battery impedance with battery temperature, thus providing in-built temperature compensation.

Advantageously, because the shape of the interrelationship between battery voltage, impedance and temperature is substantially uniform from one battery to another (for a given battery construction and chemistry), it can be a relatively straightforward matter to apply a battery-specific correction to the equation, which may be based on as few as two calibration data points, to modify the equation to "match" differently-rated batteries of a similar type. This may enable a single equation to be developed for a given battery type (construction and chemistry), which can be modified subsequently by a relatively quick and inexpensive re-calibration process, whereby the absolute values for the battery under test are re-mapped, assuming that the shape of the interrelationship between the parameters (temperature, voltage and impedance) are substantially uniform across different batteries of a particular type. This can enable the characterization of a rechargeable battery to be completed in a simple manner, minimizing the number tests and greatly reducing the experimentation time.

The equation suitably assumes that the battery's impedance varies as a function of its temperature: increasing as temperature drops, but at the same time, the impedance increases at higher voltages when the temperature decreases. This relationship is shown, schematically, in FIG. 1 of the drawings, whereby the battery impedance (vertical axis) is plotted against voltage (horizontal axis) for different temperatures. It will be noted from FIG. 1 that, at each temperature point, the shape of the impedance-voltage curve changes.

A second aspect provides an equation relating the instantaneous state of charge of a rechargeable battery to its instantaneously-measured temperature, impedance and voltage.

Suitably, the equation is applicable at relatively low temperatures, such as below 20° C. or 10° C.

BRIEF DESCRIPTION OF THE DRAWINGS

An embodiment of the invention shall now be described, by way of example only, with reference to the accompanying drawings in which.

DETAILED DESCRIPTION OF THE DRAWINGS

In an embodiment, the battery impedance is measured at 25° C. (ambient temperature) and from this measurement the variation in temperature can be described by a first equation (Eq. 3) when the temperature is above 25° C. and by a second equation (Eq. 4) when the temperature is below 25° C.

The second equation (Eq. 4) uses an exponential function that loosely follows an Arrhenius law. As such, this suitably takes into account the dependence of the exponential parameter using the temperature and certain basic parameters of the battery.

When the temperature is above 25° C. (T>25° C.), a simple linear variation of the impedance with the temperature should be used (Eq. 3).

$$Z_{int}(T)=Z_{int}(25° \text{ C.})\times(1+A\times(T-25° \text{ C.})) \quad \text{(Eq. 3)}$$

Where
T is the temperature
$Z_{int}(T)$ is the impedance at the temperature T (T>25° C.)
$Z_{int}(25° \text{ C.})$ the impedance at ambient temperature 25° C.
A is the coefficient of the temperature difference In the first equation (Eq. 3), the coefficient A can be estimated by a high temperature discharge and the coefficient A is typically around 0.005 for most batteries. The value of A is a function of the battery, and can be adjusted to suit different batteries.

However, when the temperature is below 25° C. (T<25° C.), the impedance can be calculated as a function of the temperature according to the second equation (Eq. 4) below:

$$Z_{int}(T)=Z_{int}(25° \text{ C.})\times\exp(B\times(V_{OCV}-V_{Bat})) \quad \text{(Eq. 4)}$$

Where
T is the temperature
$Z_{int}(T)$ is the impedance at the temperature T (T<25° C.)
$Z_{int}(25° \text{ C.})$ the impedance at ambient temperature 25° C.
B is the exponential coefficient that depends on temperature
$V_{OCV}$ is the open-circuit voltage of the battery
$V_{Bat}$ is the battery voltage The coefficient B in the second equation (Eq. 4) contains the temperature variation, a simulation of the impedance, and a comparison with a measured value. As such, coefficient B can be, in an embodiment, fitted to a linear equation, which varies as a function of temperature, as shown in Equation 5 below:

$$B=\text{coeff}_{direction}\times T+\text{coeff}_{offset} \quad \text{(Eq. 5)}$$

Where
T is the temperature
$\text{Coeff}_{direction}$ is a director coefficient of the line equation
$\text{Coeff}_{offset}$ is the offset of the line equation These parameters can be readily determined by taking different temperature measurements for a battery. Experimentally, these coefficients have been measured for a first type of battery and the coefficients were found to be −0.16 and 3.7, respectively.

Figure 1:
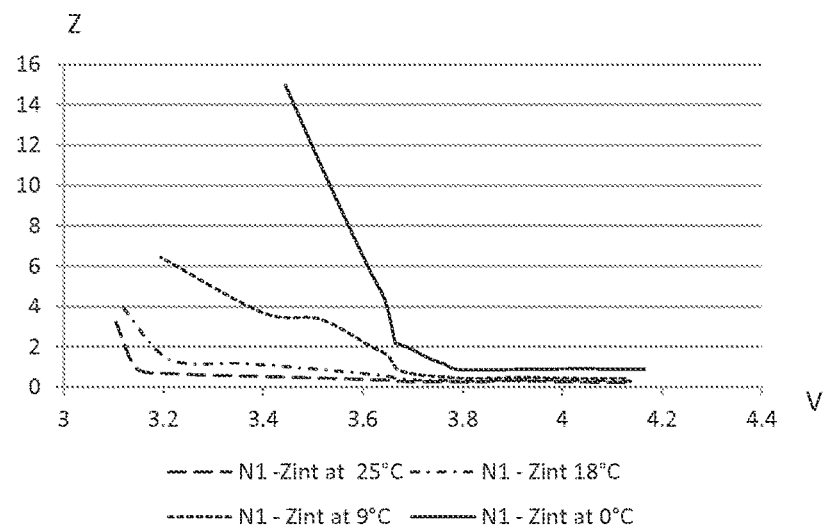
FIG. 1 is a graph showing how the battery impedance (Z) varies with voltage (V) at different temperatures.
Figure 2:
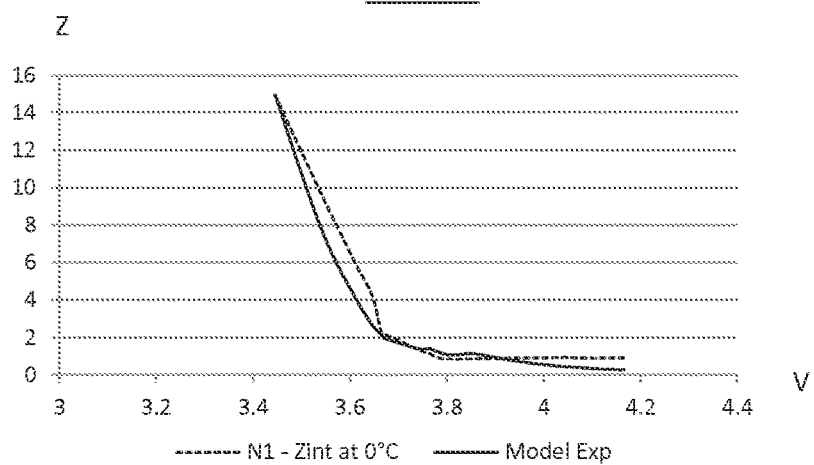
FIG. 2 is a graph showing battery impedance (Z) for a first type of battery versus voltage (V) at 0° C. as measured (dotted line) versus calculated (solid line) according to Equation 4 below.

In FIG. 2, the impedance (vertical axis) was measured as a function of voltage (horizontal axis), at 0° C. for a first type of battery, and this is plotted in FIG. 2 as the dotted line. Comparing this with the calculated result using Equation 4 above (solid line), it can be seen that there is now a good correspondence between the two. As such, it can be seen that this can be used to successfully model, and hence calculate the SoC for this type of battery, without the use of look-up tables for the temperature correction.

Nevertheless, in FIG. 2 it can be seen that the model's accuracy tails-off at higher battery voltages. As such, an offset can be used to re-shape the model in this region of the graph, which is particularly the case where the temperature falls below ~0° C. In such a situation, the two models must be used in parallel, such that when the impedance calculated by Equation 4 above is higher than the impedance calculated from the impedance at 25° C. plus the offset, then the value calculated from Equation 4 can be used as the battery impedance value.

The offset is suitably calculated, and experiments have shown that the using a non-linear offset, and specifically an exponentially-varying function, can give excellent results. It has been found that the offset to add to the battery impedance to arrive at a more accurate value at a given temperature T can be calculated using Equation 6 below:

$$Z_{int}(T_{high\ voltage})=Z_{int}(25° \text{ C.},V_{bat\_max})\times\exp(C\times(25° \text{ C.}-T)) \quad \text{(Eq. 6)}$$

Where
T is the temperature
$Z_{int}(T)$ is the temperature at the temperature T
$Z_{int}(25° \text{ C.}, V_{Bat\_max})$ is the impedance at the maximum battery voltage (4.2V or 4.35V currently with the li-ion technology on the market)
C is an exponential coefficient that must be determined by characterization That said, it is not always necessary to correct Z(T) using Equation 6 because the SoC is only affected at high SoC values. Thus, when the critical SoC is reached the Z(T) is controlled by Equations 4 and 5 above, and that has been found to yield sufficient accuracy to reliably inform an end-user that they should re-charge their device.

Figure 3:
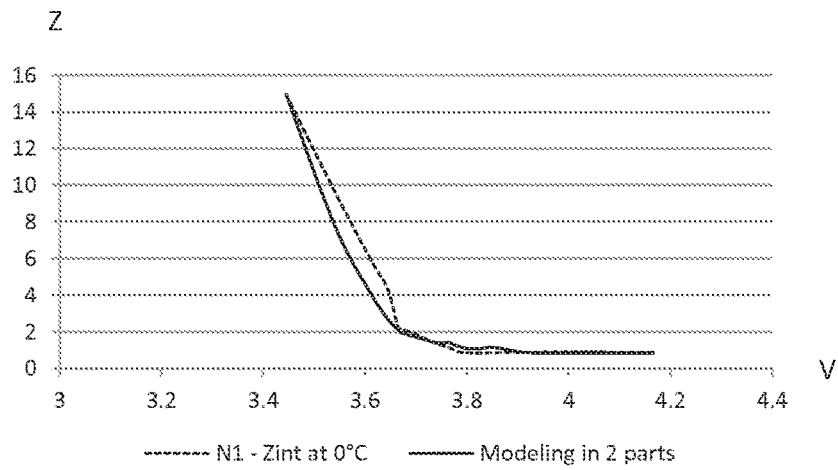
FIG. 3 is a graph showing battery impedance (Z) for the first type of battery versus voltage (V) at 0° C. as measured (dotted line) versus calculated (solid line) according to Equation 4 below using an offset calculated according to Equation 5 below.

The result of applying the offset can be seen by comparing FIG. 3 with FIG. 2 of the drawings, whereby the impedance is calculated using both models, but where the higher impedance value is used where the two differ. As can be seen, the correspondence between the measured and calculated values of battery impedance is now much higher.

Figure 4:
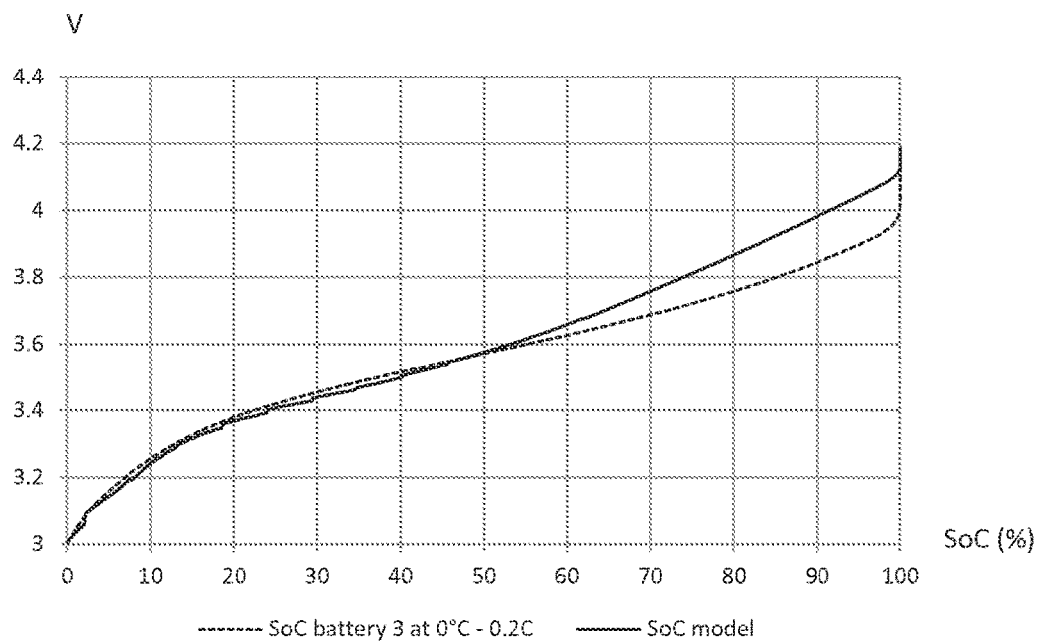
FIG. 4 is a graph showing, the relationship between battery voltage (V) as a function of the state of charge (horizontal axis) for a a second type of battery at ~0° C., as measured (dotted line) and as calculated (solid line) according to the invention.

The coefficient C is in the range of 0.052 for the first type of battery that was tested experimentally. This value was then used, as shown in FIG. 4, for a second type of battery, with excellent results. The offset can provide a good approximation of the SoC of the battery at low temperature and at high voltage.

Using Equations 4 to 6 above, it is now possible to model the SoC for the battery, and this is shown in FIG. 4 of the drawings, whereby there is a good correlation between the actual measured values and the values calculated according to the equations, especially towards the lower end of the SoC scale (horizontal axis).

The model described above for the first type of battery was then modified to "fit" other types of batteries. Specifically, in one experiment, conducted on a second type of battery, it was found, that the calculated value, using Equation 4, already corresponds approximately with the actual measured value, as shown in FIG. 4 of the drawings, even using the equation for the first type of battery in an unmodified form.

Figure 5:
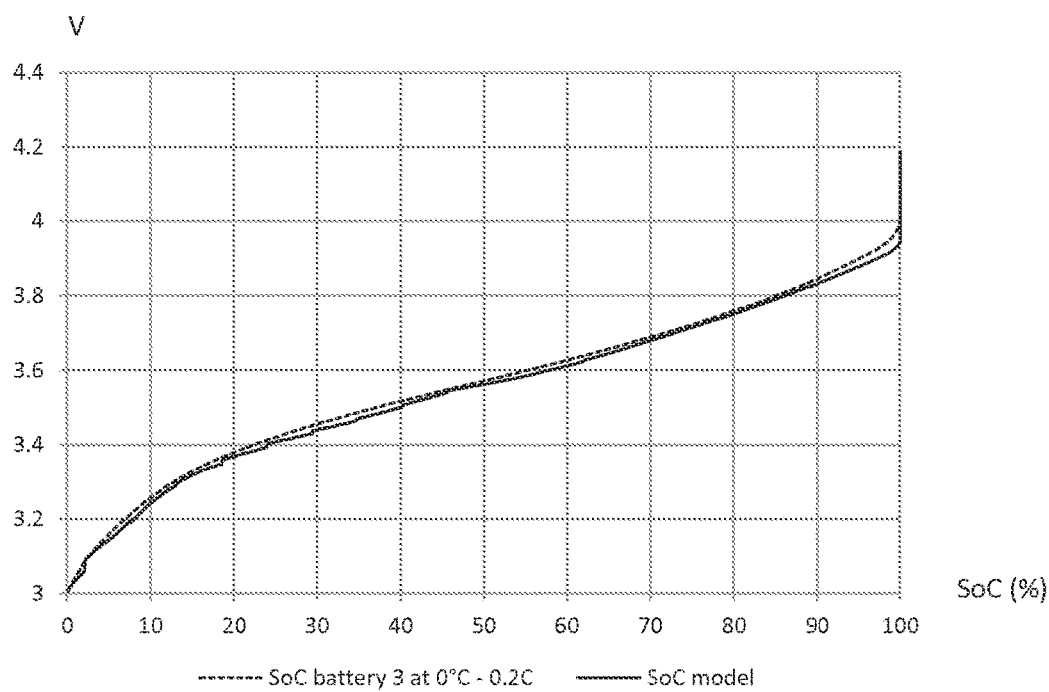
FIG. 5 is a graph showing, the relationship between battery voltage (V) as a function of the state of charge (horizontal axis) for the second type of battery at ~0° C., as measured (dotted line) and as calculated (solid line) according to the invention using an improved model according to the invention.

However, when equation 5 is used as well using slightly different coefficients, that is to say, to factor-in an adjustment for the battery type, the correspondence between the actual SoC as determined by measurement (the dotted line in FIG. 5) and the calculated value using the equations (solid line in FIG. 5) is very high. In this case, Coeff$_{offset}$ in Equation 5 was modified to obtain a value of 3.3 instead of 3.7 for the first type of battery.

As such, it has been shown that the equations can be applied reliably to different battery types, with a characterization of the actual battery being carried out for as few as two temperature points, to enable the calculated SoC value to be fitted to an actual, measured SoC value.

Nevertheless, it experiments conducted on a range of batteries have revealed that for a given battery technology (e.g. chemistry and construction), the coefficients are approximately the same in each case, meaning that no, or only a minimal correction is needed for an SoC algorithm, which potentially means that no further measurements need to be taken for different batteries of the same type. This is great commercial importance because it vastly reduces the need for experimental testing of batteries in order for the SoC implementation to operate accurately.

Possible advantages include:

The provision of a model for the impedance variation with the temperature, i.e. temperature compensation. The use of an algorithm, as opposed to a look-up table, eases battery impedance calculations and facilities software SoC implementations, it can vastly reduce the number of temperature characterization measurements that need to be taken for a battery, the use of a mathematical model, as opposed to a look-up table, yields more accurate results, especially given that, in many cases, there is just one "low temperature" look-up table, and that the impedance can be calculated easily for any given temperature.

The invention is not restricted to the details of the foregoing embodiments, which are merely exemplary of the invention. For example, the coefficients and parameters stated are applicable to specific types of battery, and these could be varied to suit different battery types and configurations.

What is claimed is:

1. A method of calculating the remaining state of charge of a rechargeable battery, the method comprising the steps of:
    measuring the instantaneous voltage, impedance and temperature of the battery, and
    inputting the measured voltage, impedance and temperature values into an equation, wherein the equation yields a state of charge value that is a function of said measured voltage, impedance and temperature values;
    wherein the equation comprises a first equation if the temperature of the battery is above a threshold temperature value, but a second equation different in form from the first equation if the temperature of the battery is below the threshold temperature value.

2. The method as claimed in claim 1, wherein the threshold temperature is selected from the group consisting of: substantially 25° C., substantially 20° C. and substantially 10° C.

3. The method as claimed in claim 1, wherein the first equation is:

$$Z_{int}(T)=Z_{int}(25°\ C.)\times(1+A\times(T-25°\ C.)),$$

where T is the temperature, $Z_{int}$(T) is the impedance at the temperature T (where T>25° C.), $Z_{int}$(25° C.) the impedance at 25° C.; and A is the coefficient of the temperature difference.

4. The method as claimed in claim 3, wherein the coefficient A is estimated via a high temperature discharge.

5. The method as claimed in claim 3, wherein the coefficient A is substantially 0.005.

6. The method as claimed in claim 1, wherein the second equation is:

$$Z_{int}(T)=Z_{int}(25°\ C.)\times\exp(B\times(V_{OCV}-V_{Bat})),$$

where T is the measured temperature, $Z_{int}$(T) is the impedance at the temperature T (T<25° C.), $Z_{int}$(25° C.) is the impedance at ambient temperature at 25° C., B is an exponential coefficient that depends on temperature, $V_{OCV}$ is the open-circuit voltage of the battery, and $V_{Bat}$ is the measured battery voltage.

7. The method as claimed in claim 6, wherein the coefficient B is determined by the equation:

$$B=\text{Coeff}_{direction}\times T+\text{coeff}_{offset},$$

where T is the measured temperature, Coeff$_{direction}$ is a director coefficient of a line equation, and Coeff$_{offset}$ is an offset of the line equation.

8. The method as claimed in claim 7, wherein coeff$_{direction}$ is substantially −0.16 and wherein coeff$_{offset}$ is in the range of between substantially 3.7 and substantially 3.3.

9. The method as claimed in claim 3, wherein when the calculated impedance at the temperature is greater than the calculated impedance at a temperature of 25° C. plus an offset, then the calculated impedance value at the temperature is used as the battery impedance value.

10. The method as claimed in claim 9, wherein the offset is an exponentially-varying function.

11. The method as claimed in claim 10, wherein the offset is determined by the equation:

$$Z_{int}(T_{high\ voltage})=Z_{int}(25°\ C.,V_{bat\_max})\times\exp(C\times(25°\ C.-T)),$$

where T is the temperature, $Z_{int}$(T) is the impedance at the temperature T, $Z_{int}$(25° C., $V_{Bat\_max}$) is the impedance at the maximum battery voltage, and C is an exponential coefficient determined during battery characterization.

12. The method as claimed in claim 11, wherein the coefficient C is substantially 0.052.

13. A state of charge determining apparatus, comprising:
    electrical connections to a rechargeable battery,
    a circuit configured to measure, via the electrical connections, the instantaneous voltage and impedance of the battery, and measure the temperature of the battery and
    a processor configured to calculate the state of charge of the battery based on the measured voltage, impedance and temperature,
    wherein the processor is configured, in use, to calculate the state of charge using an equation which yields a state of charge value that is a function of said measured voltage, impedance and temperature values,
    wherein the equation comprises a first equation if the temperature of the battery is above a threshold temperature value, but a second equation different in form from the first equation if the temperature of the battery is below the threshold temperature value.

14. A method, comprising:
    measuring the instantaneous voltage, impedance and temperature of a battery, and calculating battery state of charge using an equation of the form:

$$Z_{int}(T)=Z_{int}(25°\text{ C.})\times(1+A\times(T-25°\text{ C.})),$$

where T is the temperature, $Z_{int}$ (T) is the impedance at the temperature T (where T>25° C.), $Z_{int}$ (25° C.) the impedance at 25° C.; and A is the coefficient of the temperature difference.

15. The method of claim 14, wherein the equation is used if the measured temperature exceeds a threshold temperature.

16. The method of claim 15, wherein the threshold temperature is 25° C.

17. A method, comprising:
measuring the instantaneous voltage, impedance and temperature of a battery, and
calculating battery state of charge using an equation of the form:

$$Z_{int}(T)=Z_{int}(25°\text{ C.})\times\exp(B\times(V_{OCV}-V_{Bat})),$$

where T is the measured temperature, $Z_{int}$ (T) is the impedance at the temperature T (T<25° C.), $Z_{int}$ (25° C.) is the impedance at ambient temperature at 25° C., B is an exponential coefficient that depends on temperature, $V_{OCV}$ is the open-circuit voltage of the battery, and $V_{Bat}$ is the measured battery voltage.

18. The method of claim 17, wherein the equation is used if the measured temperature is less than a threshold temperature.

19. The method of claim 18, wherein the threshold temperature is 25° C.

* * * * *